United States Patent
Mizuhara et al.

(10) Patent No.: US 6,717,129 B1
(45) Date of Patent: Apr. 6, 2004

(54) PHOTOELECTRIC SENSOR USING RADIATION PULSES

(75) Inventors: Susumu Mizuhara, Kyoto (JP); Arata Nakamura, Kyoto (JP); Hiroaki Nakanishi, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/617,570

(22) Filed: Jul. 11, 2003

Related U.S. Application Data

(62) Division of application No. 10/100,225, filed on Mar. 14, 2002.

(51) Int. Cl.[7] .............................................. H01J 40/14
(52) U.S. Cl. .................................. 250/214 R; 327/514
(58) Field of Search ........................ 250/214 R, 214 C, 250/214 AL; 327/514; 356/221–223, 226

(56) References Cited

U.S. PATENT DOCUMENTS 6,600,146 B2 * 7/2003 Osako et al. ......... 250/214 LS

FOREIGN PATENT DOCUMENTS

JP           S61-15421         1/1986

* cited by examiner

Primary Examiner—David Porta
Assistant Examiner—Patrick J. Lee
(74) Attorney, Agent, or Firm—Beyer Weaver & Thomas LLP

(57) ABSTRACT

A photoelectric sensor has an emitting device for emitting radiation pulses repeatedly and a receiving device for receiving these pulses. The receiving device includes a converter such as a photoelectric converter to convert the received radiation pulses into electrical pulses. On the basis of a known waveform characteristic or characteristics of true electrical pulse it is judged if a pulse which appears on the output line of the converter is a true electrical pulse caused by receiving the radiation pulse emitted from the emitting device or a false electrical pulse caused by noise. The result of this judgment is outputted from an output device. The emitting device may serve to emit the pulses according to a specified bit pattern and the receiving device may serve to compare the pattern of received pulses simultaneously with two or more standard bit patterns and to thereby distinguish between true and false electrical pulses.

6 Claims, 14 Drawing Sheets

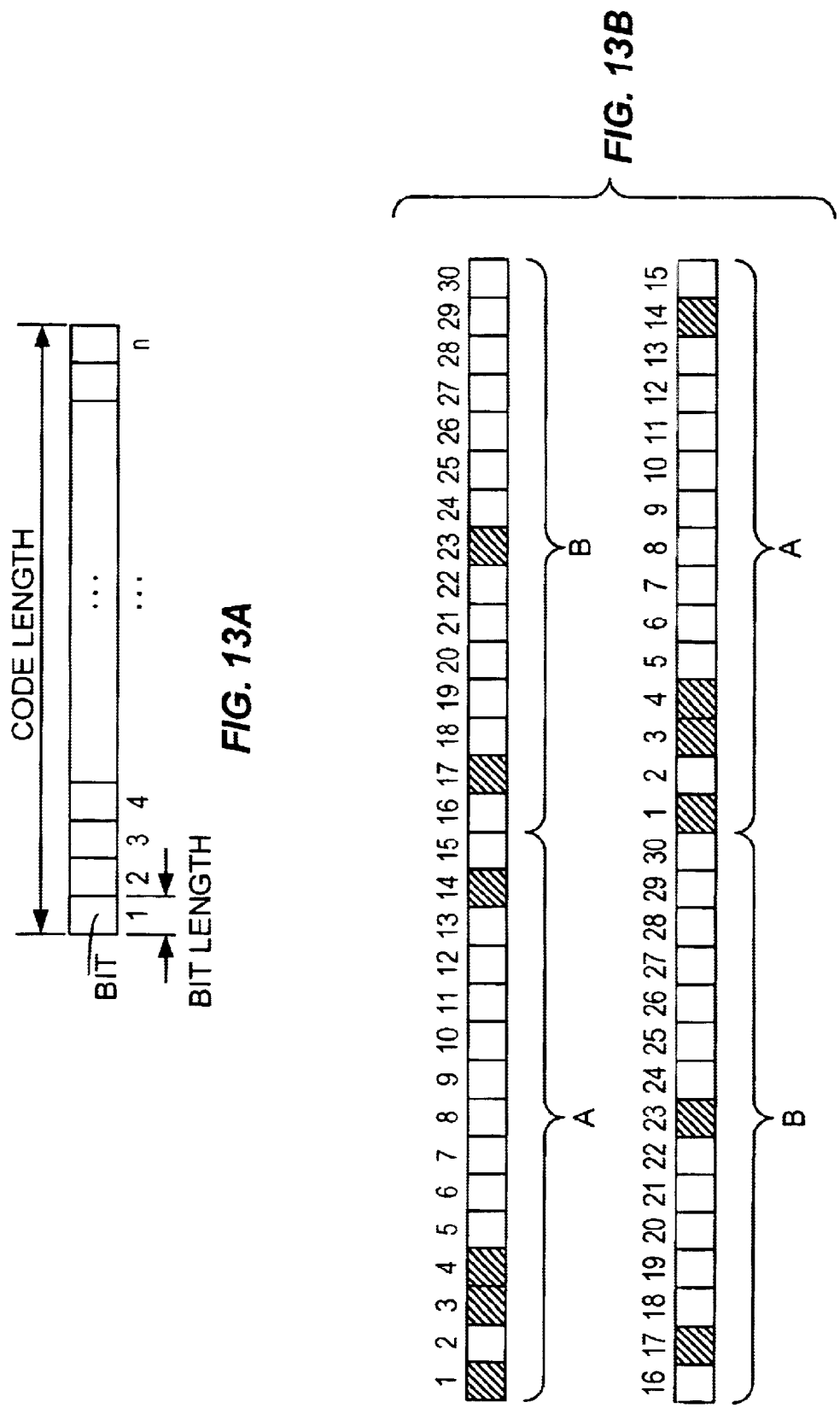

PHOTOELECTRIC SENSOR USING RADIATION PULSES

This is a division of application Ser. No. 10/100,225 filed Mar. 14, 2002.

BACKGROUND OF THE INVENTION

This invention relates to photoelectric sensors using radiation pulses. In particular, this invention relates to such a photoelectric sensor incorporating means for effectively preventing misjudgments even where a noise pulse appears periodically and where the timing of the appearance of the noise is close to that of the timing of the sampling.

It has been known to use such sensors using radiation pulses to detect in a non-contacting manner the presence or absence of a target object, its distance and its shape. Examples of radiation pulses include light pulses, supersonic wave pulses, microwave pulses and impulse-type electromagnetic waves.

In general, such a sensor using radiation pulses includes a transmitting device for transmitting radiation pulses to a target area (also called a light emitter or a wave transmitter) and a receiving device for receiving radiation pulses coming from the target area (also called a light receiver or a wave receiver). Such a sensor may be of a transmission type or a reflection type. Radiation pulses transmitted from a sensor of the transmission type fail to reach its receiver if screened by a target object to be detected. Radiation pulses transmitted from a sensor of the reflection type reach the receiver by being reflected by the target object.

The transmitter and the receiver devices may be contained in one container or in separate housings. The type with the devices integrated within one container is advantageous in that the two devices can be easily correlated (or synchronized). Many sensors of the reflection type and many sensors of the transmission type with separate heads (such as those using optical fibers) are formed with the transmitter and receiver devices integrated. Many sensors of the transmission type of other kinds are formed with the transmitter and receiver devices separated.

Where a sensor using radiation pulses is set, there is usually all kinds of noise such as light, sound and electromagnetic waves, in addition to the regular radiation pulses. Affected by such noise of all kinds, noise pulses appear on the output line passing through the coupling capacitor of a detection converter (such as photoelectric converting element, ultrasonic-electrical converting element, magnetic-electric converting element, etc.) in the receiving device either through the converter or through the power line. Some noise pulses will appear periodically while some will appear randomly.

Measures of various kinds have been taken for preventing erroneous operations of the receiving device caused by noise pulse. One example of such measures depends on the technology of synchronized wave detection. With a sensor using this technology, the transmission of pulses from the transmitting device and the sampling by the receiving device are synchronized. Another method is based on the continuous nature of the received array of pulses. The output from a sensor adopting this technology will not be switched on unless more than a specified number of pulses are received continuously. Once the sensor output is switched on, it is not switched off unless a specified number of continuous pulses fail to be received. In other words, there is a hysteresis characteristic at the points of switching on and off. Still another method of preventing errors is to use both the synchronization technology and the pulse array. By this method, noise pulses which are off the timing of sampling are eliminated firstly by the synchronization technology and then the pulse row method is used next to eliminated the noise pulses which happened to coincide with the sampling timing.

These prior art methods are relatively effective against randomly appearing noise pulses but are nearly ineffective against noise pulses which appear periodically especially if the timing of their appearance coincides with the sampling timing. Such a situation frequently appears when a photoelectric sensor is set inside a factory or a storehouse with a fluorescent lamp of either the common frequency type or the inverter type or when a sensor of various kinds using radiation pulses is set inside a factory where a welding machine or a supersonic washing machine generating periodic electromagnetic noise is present. Since the timing of sampling for such a sensor is restricted in view of the response time required of the sensor, it cannot be freely changed to avoid the noise pulse.

SUMMARY OF THE INVENTION

It is therefore an object of this invention to provide a photoelectric sensor using radiation pulse which can function correctly even in the environment where noise pulse appears periodically and the timing of its appearance coincides with the sampling timing of the sensor.

It is another object of this invention to develop various technologies for such a sensor.

A sensor embodying this invention may be characterized not only as comprising an emitting device for emitting radiation pulses repeatedly and a receiving device for receiving these radiation pulses, but also wherein the receiving device includes converting means for converting the received radiation pulses into electrical pulses, wherein the receiving device contains pulse judging means for judging whether an electrical pulse appearing on the output line of the converting means is a true electrical pulse caused by receiving the radiation pulse emitted from the emitting device or a false electrical pulse caused by noise on the basis of a known waveform characteristic (or characteristics) of the true electrical pulse, and wherein the receiving device generates an output signal on the basis of result of judging by this pulse judging means. With a sensor thus structured, it is possible to distinguish between true and false electrical pulses not only when the noise pulse appears randomly but also if the noise pulse is generated periodically with the timing of generation coinciding with the timing of sampling.

In the above, the "known waveform characteristic" of a true electrical pulse may be selected as values of the waveform at two or more standard points in time such as times corresponding to peaks of the waveform. It is preferable that these peaks include both peaks with positive and negative polarities. Alternatively, the known wave characteristic may be a value of the waveform obtained by differentiating the true electrical pulse which appeared.

The aforementioned pulse judging means for distinguishing between true and false electrical pulses may comprise two or more comparators each for comparing signal level appearing on the output line of the converting means with a standard value corresponding to the true electrical pulse, delay means for delaying an output of one of the comparators such that the outputs from the comparators are adjusted in time such that the standard times associated with the outputs will match, and logical calculation means for carrying out logical calculation on the time-adjusted outputs from the comparators.

A sensor according to another embodiment of the invention may be characterized also as comprising an emitting device for emitting radiation pulses repeatedly and a receiving device for receiving these radiation pulses, but its emitting device includes pulse transmitting means for transmitting the radiation pulses according to a specified bit pattern and its receiving device includes not only pulse judging means as explained above but also bit pattern judging means for making a comparison between the bit pattern of electrical pulses judged by the pulse judging means to be a true electrical pulse and a standard bit pattern and judging according to the result of this comparison whether radiation pulse was normally received. In the above, the "standard bit pattern" used by the bit pattern judging means for the comparison need not be the same as the "specified bit pattern" used by the emitting device, as long as they are correlated. With a sensor thus structured, distinction between true and false electrical pulses can be made even more accurately because the matching is made also in terms of their bit patterns.

It is preferable that the bit pattern judging means simultaneously compare the bit pattern of the electrical pulses appearing on the output line of the converting means with two or more preselected standard bit patterns having different phases, such that the sensor can depend on the results of these comparisons to judge whether or not the radiation pulses were normally received.

The expression "different phases" used above is intended to be interpreted broadly, including patterns with different bit arrangement (arrangement of bits representing transmission and bits representing non-transmission). For example, if there are two patterns A and B defined and if pulse transmission is carried out as A→B→A→B . . . , both A+B and B+A may be used as standard bit patterns. If this is done, a matching is found whether the pattern appearing on the output line happens to start with A or with B. Thus, the bit pattern judgment can be effected more quickly and more dependably, that is, the response time of the sensor is improved.

It is also preferable that redundancy is provided in the matching by the bit pattern judging means such that even if some of the bits in the appearing pattern are different from what they normally should have been due, for example, to noise of some kind, a correct judgment can be made within a limit allowable by the redundancy. In general, it seldom happens that a bit which should indicate presence of pulse fails to so indicate. Situations may be more frequent where a bit which should indicate absence of pulse happens to indicate the presence of a pulse, but this kind of error can be effectively avoided by providing redundancy in the bit pattern judging means.

A photoelectric sensor according to still another embodiment of this invention may be characterized wherein the emitting device includes pulse transmitting means for transmitting light pulses according to an emission bit pattern based on arrangement of bits each indicating emission and non-emission of light, respectively, and wherein the receiving device includes bit generating means for generating light indicating bits each indicative of whether or not an electrical pulse appeared on the output line of the converting means and bit pattern judging means for making a comparison between a received bit pattern based on the light indicating bits and a standard bit pattern based on the emission bit pattern. The sensor judges from the result of this comparison whether light pulses emitted from the emitting device have been normally received and generates an output signal on the basis of the result of judging by said bit pattern judging means.

Here, too, the "standard bit pattern" need not be the same as the "emission bit pattern" as long as they are correlated. A photoelectric sensor of this type can correctly distinguish between true and false electrical pulses even if there is a noise pulse appearing on the output line at the same timing as the sampling timing. In this application, it is preferable to preliminarily provide a plurality of such emission bit patterns each having a different arrangement of the bits indicating emission and non-emission of light such that judgment can be effected even more accurately. Means for generating emission bit patterns randomly may also be provided. In such a case, there must also be provide a means for communicating data between the light emitting and receiving devices. The emission bit pattern may arrange the bits indicating emission and non-emission of light in arrays.

It is preferable also in this example to preliminarily provide two or more standard bit patterns with different arrangements of bits indicating emission and non-emission of light such that the bit pattern judging means can make comparisons with the plurality of standard bit patterns. As explained above, if there are two patterns A and B defined and if pulse transmission is carried out according to pattern A→B→A→B . . . , both A+B and B+A may be used as standard bit patterns. If this is done, a matching is found whether the pattern appearing on the output line happens to start with A or with B. Thus, the bit pattern judgment can be effected more quickly and more dependably, that is, the response time of the sensor is improved. It is also preferable to provide redundancy to the process of matching in this example.

It is preferable, furthermore, that at least two bits for indicating light emission be contained in a row in the emission bit pattern. A short noise such as so-called shot noise with duration less than 2 bits can also be identified if the bit pattern judging means is programmed to identify emission only if two successive bits indicate light emission. The number of bits and the emission bit pattern, as well as the length of bit in the emission bit pattern may be made variable.

BRIEF DESCRIPTION OF THE DRAWINGS

FIGS. 13 and 14 are diagrams for explaining various aspects of bit patterns.

Throughout herein, comparable or at least similar components are indicated by the same symbols for the sake of simplicity of disclosure and not necessarily explained repetitiously even if these components are components of different sensors.

DETAILED DESCRIPTION OF THE INVENTION

Figure 1:
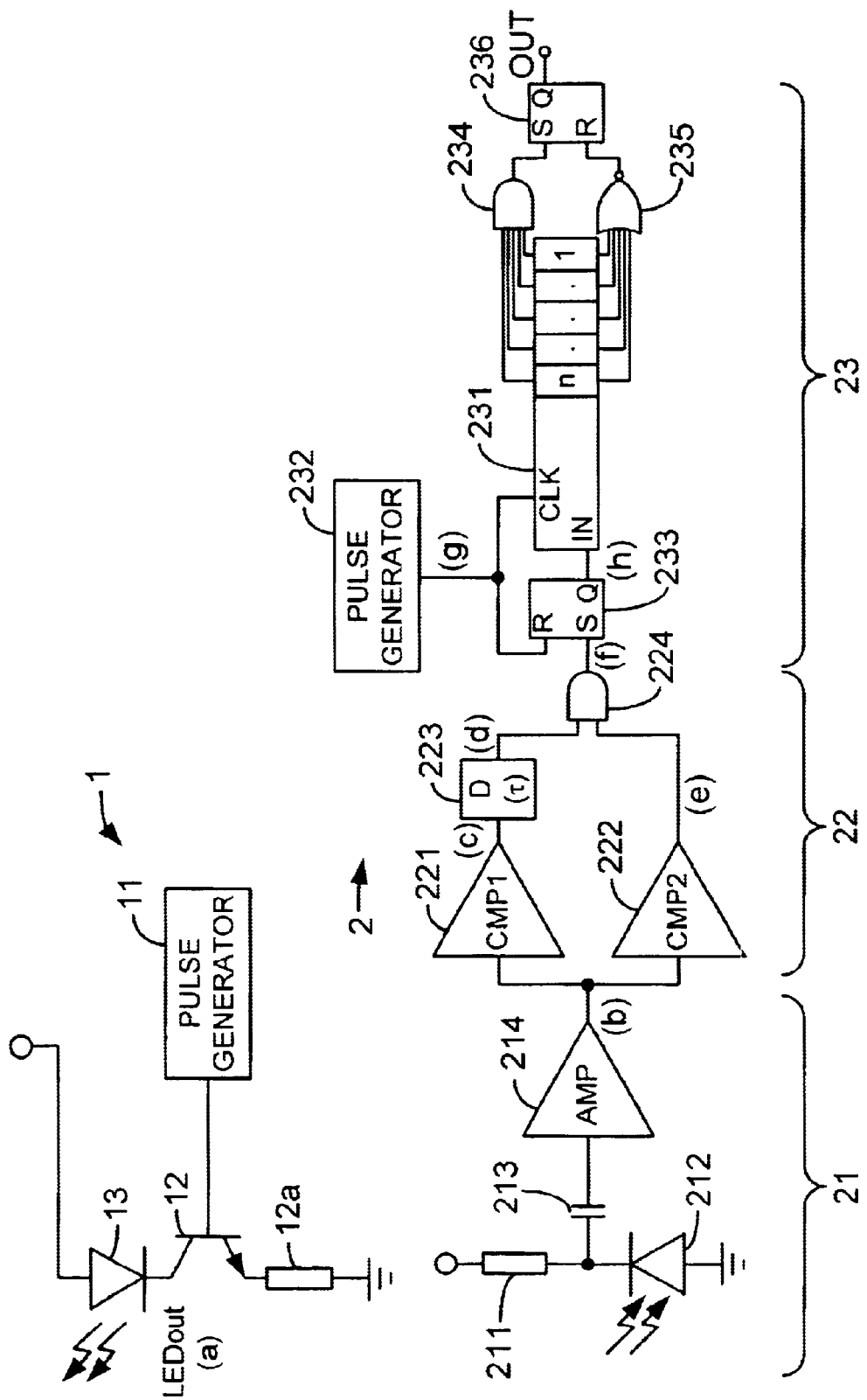
FIG. 1 is a block diagram of a sensor according to a first embodiment of this invention.

The invention is described next by way of examples. FIG. 1 shows a sensor embodying this invention, comprised of a light emitting device 1 and a light receiving device 2, which are shown together next to each other for the convenience of disclosure.

The light emitting device 1 includes a pulse generator 11 for outputting a driving pulse at a specified frequency for controlling the timing of light emission, a driver circuit 12 (shown as a grounded emitter transistor having emitter resistance 12a) operated by the pulse from the pulse generator 11 and a light emitting element 13 (shown as an LED for emitting infrared or visible light) to be driven by this driver circuit 12. Pulsed light with a fixed period is emitted from the light emitting element 13 towards a target area in synchronism with the driving pulse from the pulse generator 11.

The light receiving device 2 includes a photoelectric converter 21 for converting the light pulse received from the target area into an electric pulse, a pulse judging circuit 22 for determining whether the electrical pulse appearing on the output line of this photoelectric converter 21 is a true electric pulse or a false electric pulse and a low pass filter 23 for filtering the pulse outputted from the pulse judging circuit 22.

In this example, the photoelectric converter 21 is shown as comprising a resistor 211 connected in series between a power source and the ground, a photodiode 212, a capacitor 213 for extracting the voltage change appearing at their junction and an amplifier circuit (AMP) 214 for amplifying the AC signal extracted by the capacitor 213.

The pulse judging circuit 22 includes a pair of comparators (CMP1 and CMP2) 221 and 222 set in parallel on the output side of the photoelectric converter 21, a delay circuit (D) 223 for delaying the output from one of the pair of comparators (CMP1) and an AND circuit 224 for obtaining a logical product of the outputs from the both comparators after the output from comparator CMP1 has been delayed.

Figure 8A:
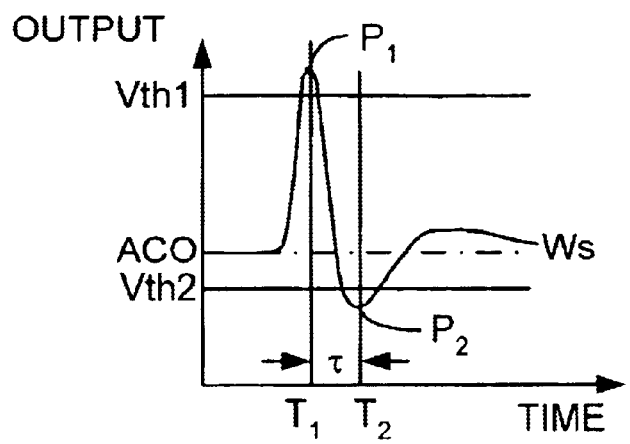
FIG. 8 shows waveform diagrams for showing examples of "known" waveform characteristics of an electrical pulse.

FIG. 8A is a graph for showing an example of an output waveform Ws of a true electric pulse (an electric pulse based on a light pulse outputted from the light emitting device) appearing on the output line of the photoelectric converter 21 (or AMP 214), characterized as having peaks P1 and P2 corresponding to the front edge and the back edge (or the overshoot) of the projected light pulse. In the graph, Vth1 and Vth2 are threshold values of the first comparator 221 (with positive polarity) and the second comparator 222 (with negative polarity), sandwiching the output voltage value AC0. Vth1 is set somewhat lower than the first peak P1 of the waveform Ws, and Vth2 is set somewhat higher than the second peak P2 of the waveform Ws. The ratios of the threshold values Vth1 and Vth2 with respect to the peaks P1 and P2 may be varied in view of considerations such as the setting condition of the sensor.

The output from the first comparator 221 is "H" (or "1") if the output level of the amplifier 214 is higher than Vth1 and is "L" (or "0") if it is lower than Vth1. The output from the second comparator 222 is "L" if the output level of the amplifier 214 is higher than Vth2 and is "H" if it is lower than Vth2. In FIG. 8A, τ indicates the delay time set for the delay circuit 223. This delay time T can be obtained as the difference between reference times (or standard times) T1 and T2 at which the two peaks P1 and P2 of the true waveform Ws appear. In other words, the delay circuit 223 outputs the result of comparison by the first comparator 221 with a delay of τ. Thus, the results of comparisons at reference times T1 and T2 are matched on the input side of the AND circuit 224 on the time axis. The output from the AND circuit 224 is "H" only when both of its inputs are "H" and is "L" in all other situations.

With reference back to FIG. 1, the (digital) low pass filter 23 comprises an n-stage shift register 231, a pulse generator 232, a first flip-flop 233, and an AND circuit 234, a NOR circuit 235 and a second flip-flop 236. The shift register 231 has a data input terminal IN and a clock input terminal CLK. The pulse generator 232 is for outputting a driving pulse at a specified frequency for controlling the timing of receiving data into the shift register 231. The first flip-flop 233 is adapted to be set by the output from the AND circuit 224 and reset by the pulse from the pulse generator 232. The AND circuit 234 is for obtaining the logical product of outputs from the individual stages of the shift register 231 and the NOR circuit 235 is for obtaining the logical inverse sum of the outputs from the individual stages of the shift register 231. The second flip-flop 236 is adapted to be set by the output from the AND circuit 234 and reset by the output from the NOR circuit 235.

In this example, the timing for the pulse generator 232 is preliminarily set in correlation with the timing for the light emission from the light emitting device 1 and the number of stages of the shift register 231. On the basis of the clock pulse from the pulse generator 232, results of true-false judgment outputted from the AND circuit 224 are inputted sequentially into the individual stages of the shift register 231. Since the timing of inputting pulse from the pulse generator 232 to the first flip-flop 233 (or the reset timing of the first flip-flop 233) should be delayed from that timing of inputting pulse from the pulse generator 232 to the clock input terminal CLK of the shift register 231 (or the data retrieving timing to the shift register), there is actually another delay circuit or the like between the pulse generator 232 and the first flip-flop 233 but this delay circuit is not shown in the figure.

When each stage (1–n) of the shift register 231 is "H" (or "1"), the output from the AND circuit 234 becomes "H", and the second flip-flop 236 become set, its output being "H", indicating that the light pulse transmitted from the light emitting device 1 has been normally received by the light receiving device 2. If each stage (1–n) of the shift register 231 is "L" (or "0"), the outputs from the NOR circuit 235 and the AND circuit are respectively "H" and "L" and the second flip-flop 236 is reset. The output from the second flip-flop 236 remains "L" until there is an input from the AND circuit 234 again.

In summary, the light receiving device 2 outputs "H" only a light pulse transmitted from the light emitting device 1 is received sequentially for a specified number of times. Since this output of "H" continues until each stage of the shift register 231 becomes "0", the hysteresis characteristic can be thereby maintained.

The principle for detection by the sensor shown in FIG. 1 is explained next with reference to the timing chart of FIG.

Figure 2:
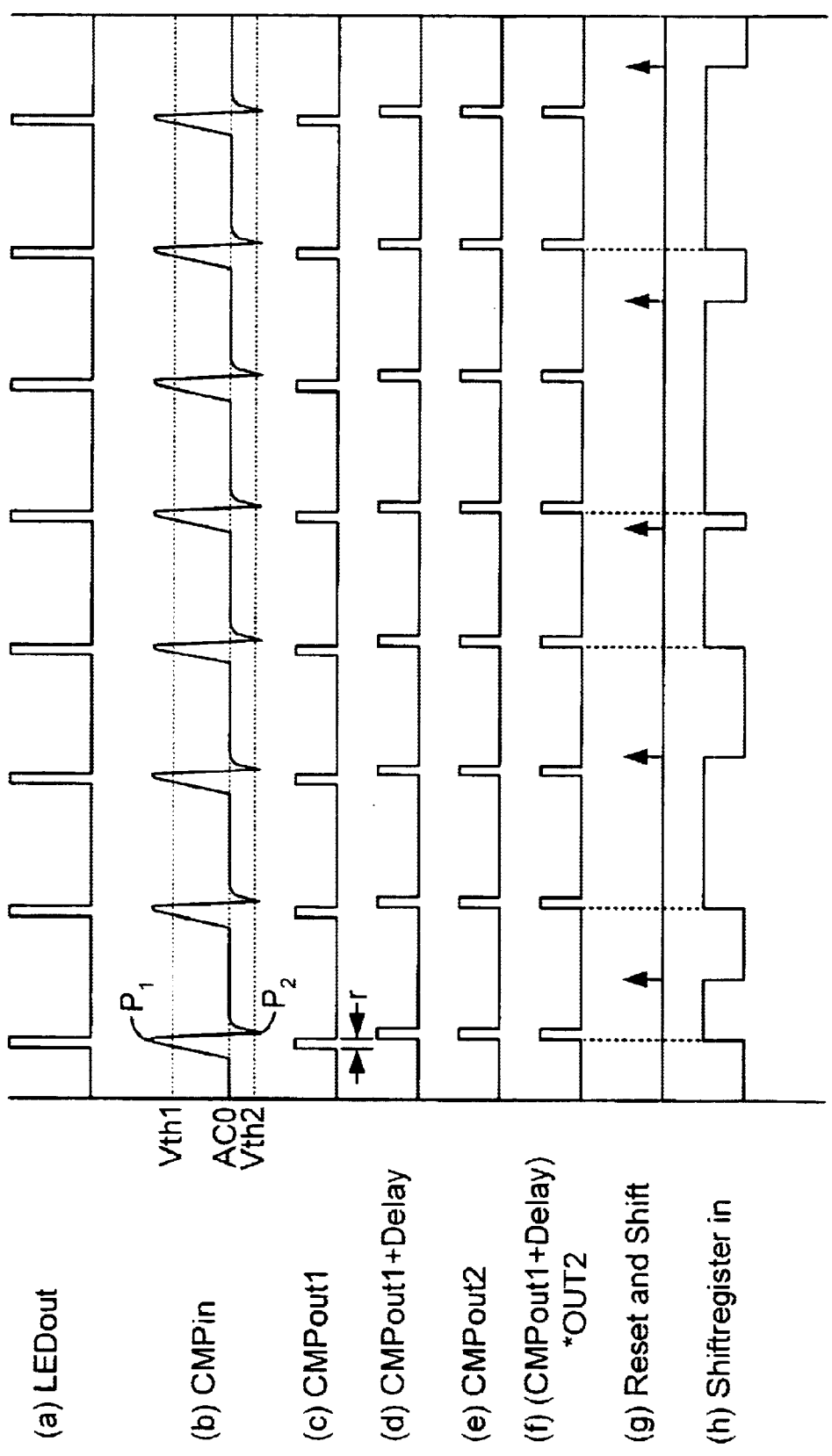
FIGS. 2 and 3 are timing charts for showing the principle of operation of the sensor shown in FIG. 1.

2. Graphs (a)–(h) of FIG. 2 each show the output condition at the corresponding one of the positions indicated by (a)–(h) in FIG. 1. Thus, Graph (a) of FIG. 2 shows the timing of light emission from the light emitting device 1 (or the pulse-generating timing of the pulse generator 11); Graph (b) shows the output of real electric pulse appearing on the output line of the photoelectric converter 21 (or the amplifier 214) or the waveform Ws; Graph (c) shows the output from the first comparator 221 with threshold Vth1; Graph (d) shows the output from the delay circuit 223 (or the output from the first comparator 221 after the delay); Graph (e) shows the output from the second comparator 222 with threshold Vth2; Graph (f) shows the output from the AND circuit 224; Graph (g) shows the timing of pulse generation from the pulse generator 232; and Graph (h) shows the output from the first flip-flop 233 (or the input to the shift register 231). It is assumed in FIG. 2 that light pulse from the light emitting device 1 is all received by the light receiving device 2.

Explained more in detail, as light pulse is transmitted at a specified frequency from the light emitting device 1, as shown in Graph (a), an electric pulse with waveform Ws having peaks P1 and P2 as shown in Graph (b) appears on the output line of the photoelectric converter 21 whenever the transmitted pulse is received. The output from the first comparator 221 remains "H", as shown in Graph (c), as long as the output value of the electric pulse exceeds Vth1. The output from the second comparator 222 is "H", as shown in Graph (e), as long as the absolute value of the electric pulse exceeds the absolute value of Vth2. As shown in Graph (d), the delay circuit 223 receives the output "H" from the first comparator 221 and outputs it to the AND circuit 224 with a delay of τ.

As explained above, the delay time τ is determined as the difference between the times of appearance of the peaks P1 and P2 of the waveform Ws. When a pulse is received from the light emitting device 1, the output from the first comparator 221 after the delay and the output from the second comparator 222 are both "H". Thus, the output of the AND circuit 224 becomes "H", as shown in Graph (f), in synchronism with the output of the second comparator 222 becoming "H". The first flip-flop 233 becomes set in synchronism with the change of the output from the AND circuit 224 to "H", as shown in Graph (h), and becomes reset in synchronism with the timing of generation (input) of a pulse from the pulse generator 232 as shown in Graph (g). Since the pulse from the pulse generator 232 is inputted also to the clock terminal CLK of the shift register 231, the output condition of the first flip-flop 233 immediately before is sequentially taken into the stages of the shift register 231, and the first flip-flop 233 becomes reset Graph (g) shows "H" five times in a row.

In this example, the pulse generator 11 of the light emitting device 1 and the pulse generator 232 of the light receiving device 2 are set to generate pulses at somewhat different frequencies, the period being slightly longer for the latter. Thus, it is not that the change in the output from the AND circuit 224 (and the pulse judging circuit 22) is taken into each stage of the shift register 231. It is the output condition of the first flip-flop 233 between the previous dining of pulse generation and the present timing of pulse generation that is sequentially taken into each stage of the shift register 231. In this manner, detection can be effected dependably even in the case of a photoelectric sensor with light emission and reception not necessarily synchronized.

Figure 3:
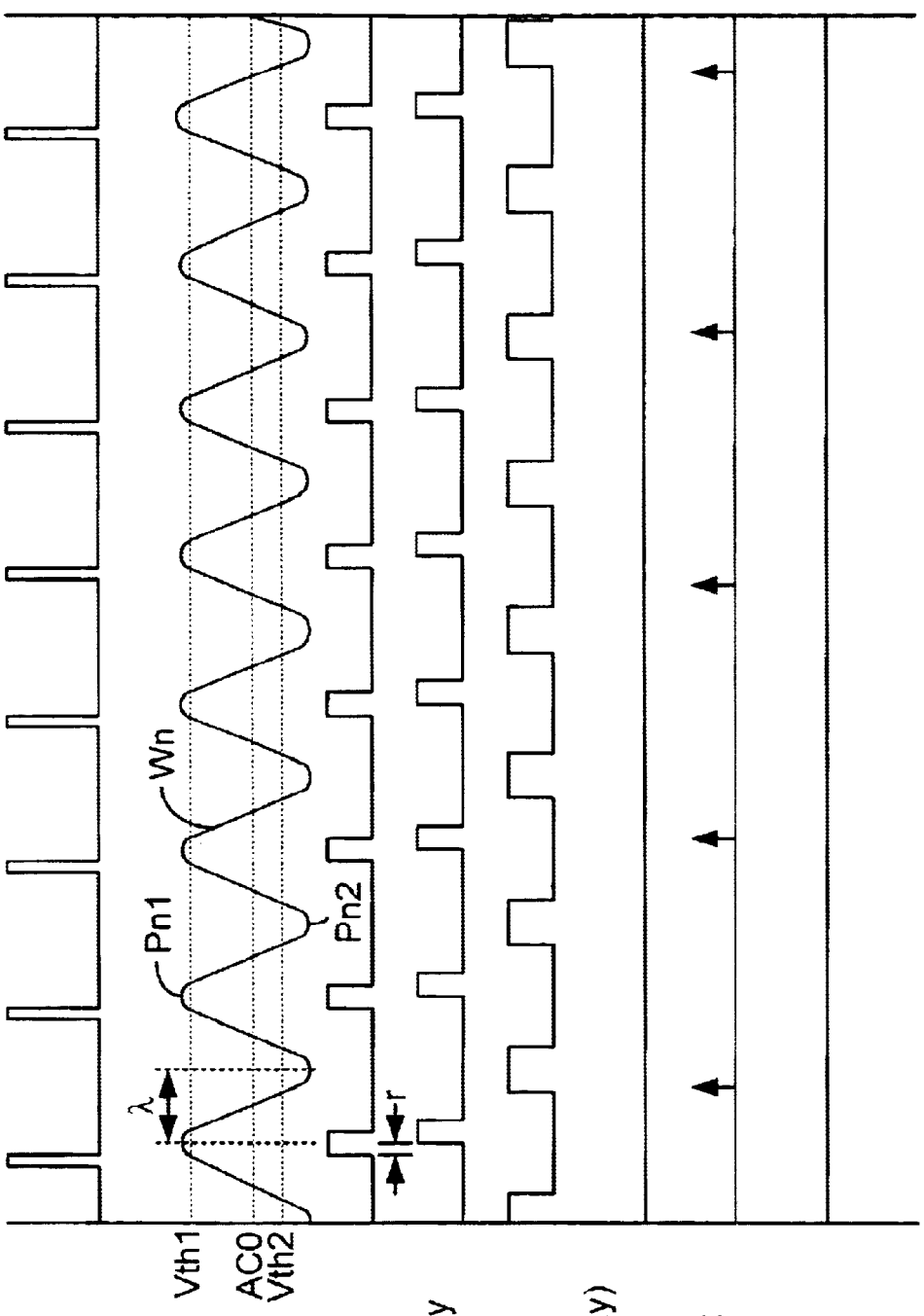

FIG. 3 shows the timing of operations of the sensor described above when there is a noise pulse (such as from external light from a fluorescent lamp) mixing into the light receiving device 2. Graphs (a)–(h) of FIG. 3, as Graphs (a)–(h) of FIG. 2, each show the output condition at the corresponding one of the positions indicated by (a)–(h) in FIG. 1. Thus, Graph (a) of FIG. 3, like Graph (a) of FIG. 2, shows the timing of light emission from the light emitting device 1, but Graph (b) of FIG. 3 shows the output of electrical pulses (with different waveform Wn having peaks Pn1 and Pn2) appearing on the output line of the photoelectric converter 21 (or its amplifier 214) due to noise pulses. Graphs (c)–(h) of FIG. 3 correspond to Graphs (c)–(h) of FIG. 2 and hence will not be described repetitiously.

It will be assumed in the following explanation that the light pulses from the light emitting device 1 are not being received by the light receiving device 2 (that is, the light receiving device 2 is receiving only the noise). It is frequently the case that the noise pulse is not strong enough to cancel the output of the true pulse or to significantly affect the output of the true pulse. Other situations, where it may be erroneously concluded that light pulse from the light emitting device is being received because of the noise which has been mixed in, will be discussed later.

FIG. 3 represents a "worst" situation, as shown in Graphs (a) and (b), where the frequency of the light pulses from the light emitting device 1 and that of the noise pulses are matching. As shown in Graph (c), the output from the first comparator 221 is "H" as long as the output of the noise pulse exceeds Vth1, and this output is transmitted by the delay circuit 223 to the AND circuit 224 with a delay of τ, as shown in Graph (d). The output from the second comparator 222 is "H", as shown in Graph (e), as long as the absolute value of the electric pulse exceeds the absolute value of Vth2.

In this example, as can be seen in Graph (b), the time interval (λ) between the appearance of the peaks Pn1 and Pn2 of the noise waveform Wn is much greater than the to delay time τ. Thus, the delayed output from the first comparator 221 and the timing of output from the second comparator 222 do not match. Thus, as shown in Graph (f), the output from the AND circuit 224 remains "L" in spite of the noise waveform Wn, unless an expected light pulse from the light emitting device 1 is received. For this reason, the output from the first flip-flop 233 remains "L", as shown in Graph (h) because the output from the AND circuit 224 is "L", independent of the timing of the pulse input from the pulse generator 232 as shown in Graph (g).

In summary, the pulse judging circuit 22 according to this embodiment of the invention distinguishes a false signal from a true signal by using the first and second comparators and a reference value according to the true signal. Next, the outputs from the comparators are matched by using a delay circuit such that their reference times will coincide. After their time axes are made to coincide, their outputs are subjected to a logical calculation to make a true-false determination on the electrical pulse appearing on the output line of the photoelectric converter 21. Thus, an erroneous judgment that light has been received can be avoided if the light pulse from the light emitting device is not being reflected back and received by the light receiving device although there may be a noise pulse present.

Figure 4:
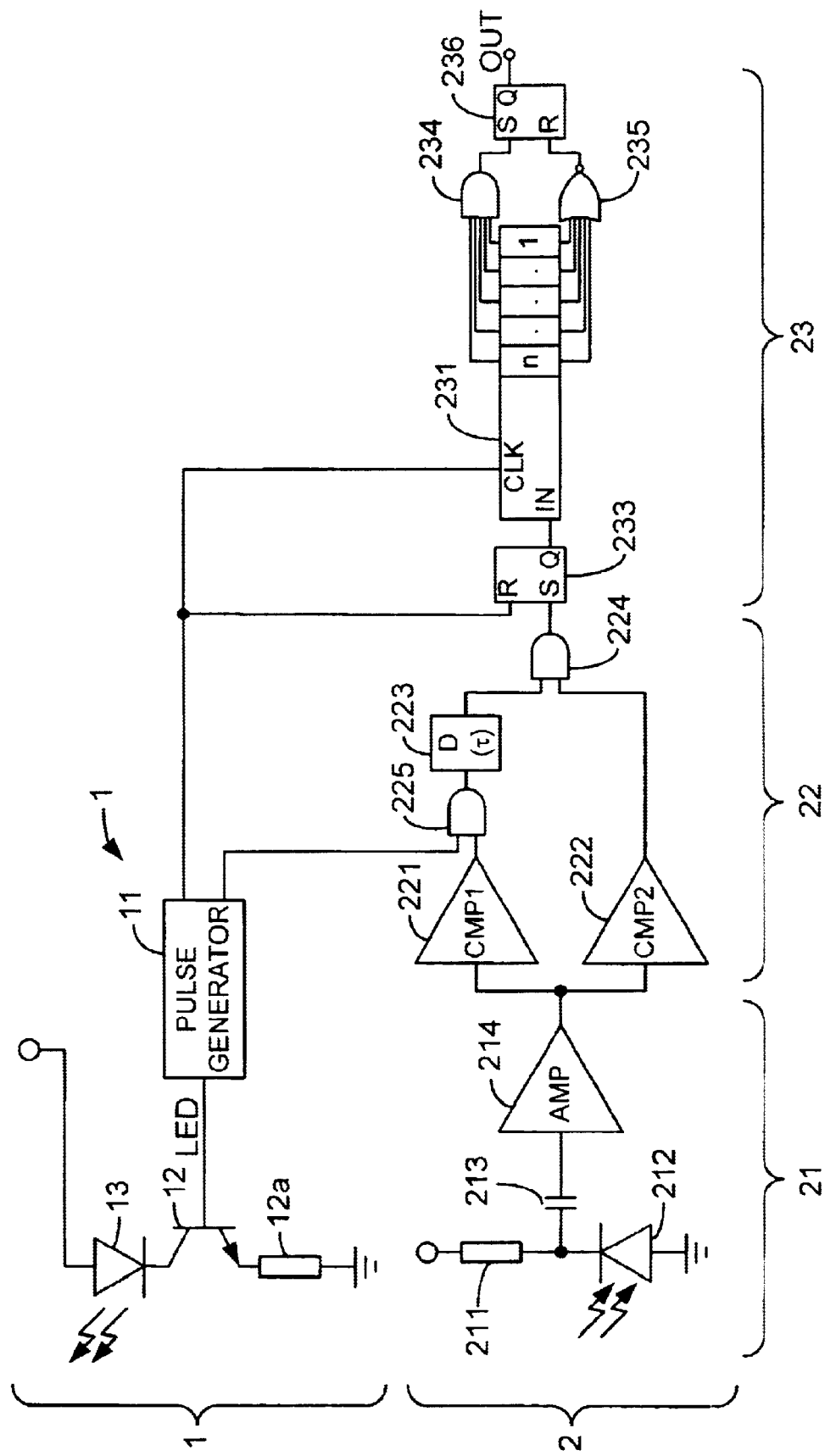
FIG. 4 is a block diagram of a sensor according to a second embodiment of this invention with an integrated light emitting and receiving parts.

FIG. 4 shows a sensor according to a second embodiment of the invention, characterized wherein the light emitting and receiving devices of the first embodiment are combined. Many of the components of the embodiment shown in FIG. 4 are similar to or the same as those described above with reference to FIG. 1. For the sake of convenience, those components which are at least similar to each other will be indicated by the same numbers and may not necessarily be explained repetitiously.

According to this embodiment, the pulse generator 232 for the light receiving device 2 shown in FIG. 1 is not required because synchronization is possible with this sensor between light emission and reception. Instead, the pulse from the pulse generator 11 for the light emitting device 1 is inputted to the reset input terminal of the first flip-flop 233 and the clock input terminal of the shift register 231. In other words, the pulse generating timing shown by Graph (g) in FIG. 2 appears in this case synchronized with the timing of emitting light from the light emitting device 1. In this manner, a change in the output from the AND circuit 224 (or the pulse judging circuit 22) can be taken into each stage of the shift register 231, and a more accurate filtering process can be carried out through the digital low pass filter 23.

In the second embodiment of the invention, another AND circuit 225 is inserted for obtaining the logical product of the output from the first comparator 221 and the pulse output from the pulse generator 11. Thus, its output is "H" if the output from the first comparator 221 is "H" when the pulse from the pulse generator 11 is inputted. In other words, the timing for the peak value P1 of a true electrical pulse can be accurately obtained at the first comparator 221 by means of this AND circuit 225. As a result, true and false electric pulses can be more accurately distinguished.

Figure 5:
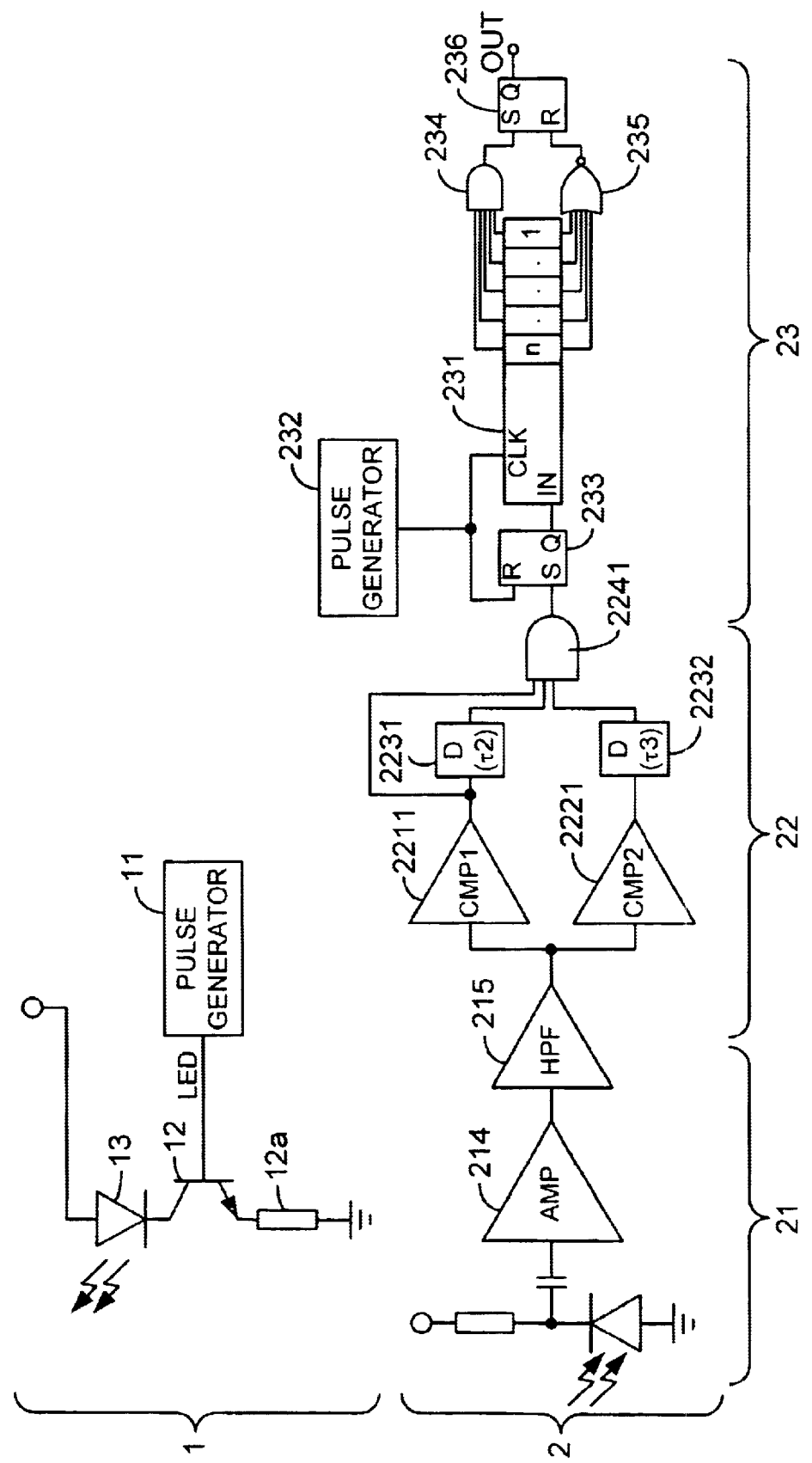
FIG. 5 is a block diagram of a sensor according to a third embodiment of this invention.

FIG. 5 shows another photoelectric sensor according to a third embodiment of the invention characterized as differentiating a true pulse to obtain a plurality (three in the example shown below) of standard values on the waveform corresponding to predetermined standard times and distinguishing between true and false pulses that appear on the output line of a converter on the basis of these standard values.

As shown in FIG. 5, it is a photoelectric sensor of the type having a light emitting device 1 and a light receiving device 2 as separate units. It is different from the first embodiment in the structure of the pulse judging circuit 22. The pulse judging circuit 22 according to the third embodiment is a differential circuit and includes a high pass filter (HPF) 215 for receiving the output from the amplifier 214, a pair of comparators (the first comparator CMP1 2211 and the second comparator CMP2 2221), a pair of delay circuits 2231 and 2232 and an AND circuit 2241. The pair of comparators 2211 and 2221 is connected in parallel to the output side of the high pass filter 215, and each of the pair of delay circuits (the first delay circuit 2231 and the second delay circuit 2232) serves to delay the output from a corresponding one of the comparators 2211 and 2221. The AND circuit 2241 is for taking the logical product of the delayed outputs from the first and second comparators 2211 and 2221 and the output from the first comparator 2211 before the delay.

Figure 8B:
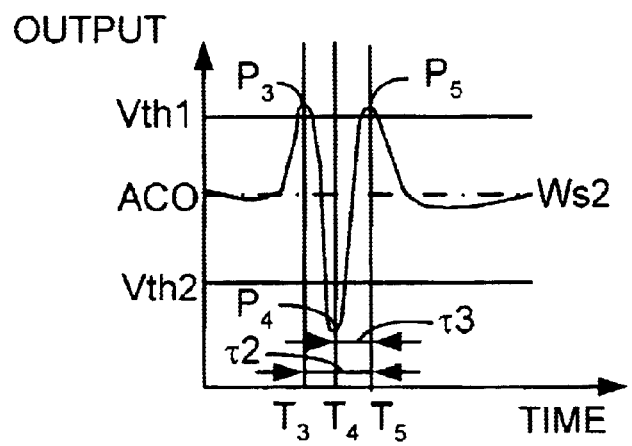

FIG. 8B shows an output waveform Ws2 with wave characteristics of an electrical pulse obtained by passing through the high pass filter 215 a true electric pulse appearing on the output line of the photoelectric converter. By this example, the wave characteristics include the three peak values (P3 with positive polarity, P4 with negative polarity and P5 with positive polarity) corresponding to the waveform Ws shown with reference to the first embodiment. In FIG. 8B, Vth1 and Vth2 which sandwich the output voltage value AC0 respectively indicate the threshold value (with positive polarity) of the first comparator 2211 and the threshold value (with negative polarity) of the second comparator 2221. The first threshold value Vth1 is set to be somewhat lower than both the first and third peak values P3 and P5 of the waveform Ws2, and the second threshold value Vth2 is set somewhat higher than the second peak value P4 of the waveform Ws2. The ratios of the threshold values Vth1 and Vth2 with respect to the corresponding peaks P3, P4 and P5 may be varied, depending on considerations such as the setting condition of the sensor.

The output from the first comparator 2211 is "H" or "L", depending on if the output level of the high pass filter 215 is higher or lower than Vth1. The output from the second comparator 2221 is "L" or "H", depending on if the output level of the high pass filter 215 is higher or lower than Vth2. In FIG. 8B, T2 indicates the delay time set for the first delay circuit 2231. This delay time 2 may be obtained as the difference between reference times T3 and T5 at which the two peaks P3 and P5 of the true waveform Ws2 appear. In other words, the result of comparison by the first comparator 2211 at reference time T5 and that at reference time T3 are simultaneously inputted to the AND circuit 2241. Similarly, τ3 in FIG. 8B indicates the delay time set for the second delay circuit 2231, which may be obtained as the difference between reference times T4 and T5 at which the two peaks P4 and P5 of the true waveform Ws2 appear. Thus, not only the aforementioned results of comparisons by the first comparator 2211 at reference times T3 and T5 but also the result of comparison by the second comparator 2221 at reference time T4 is simultaneously inputted to the AND circuit 2241.

In summary, the results of level comparisons at different reference times T3, T4 and T5 on the waveform Ws2 are matched on the time axis to be compared. The output from the AND circuit 2241 is "H" only when all three of its inputs are "H" and is "L" in all other situations. The output from the AND circuit 2241 is inputted to a digital low filter 23 structured as explained above with reference to the first embodiment.

Thus, the third embodiment of the invention is characterized wherein determination between true and false electric pulses appearing on the output line of the converter on the basis of the wave characteristic obtained by reference values (Vth1, Vth2, Vth1) at more than two (three in this example) reference times (T3, T4, T5) on the predetermined waveform Ws2 obtained by differentiating a pulse known to be a true pulse. As a result, a more accurate identification of a true pulse becomes possible.

Although an example was shown above wherein the threshold value Vth1 of the first comparator 2211 was used as the reference value at both reference times T3 and T5, an even more accurate distinction between true and false pulses becomes possible by using individually different reference values for different reference times.

Although the third embodiment was described above by way of an example structured with the light emitting and receiving devices as separate units, it may be applied equally well to a sensor with light emitting and receiving devices integrated into a single unit.

Figure 6:
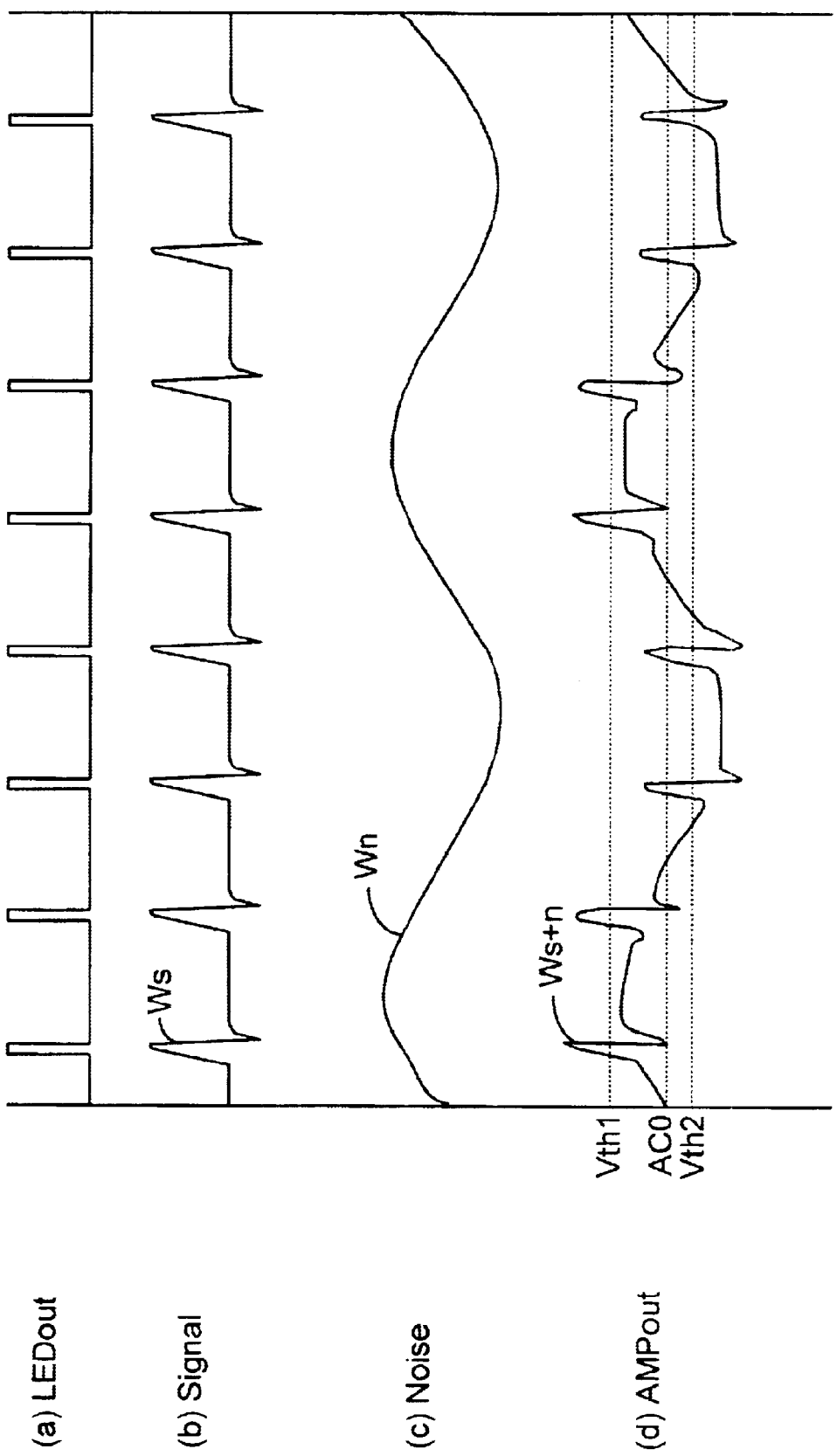
FIG. 6 is a timing chart of an electrical pulse appearing on the output line of the photoelectric converter.

As briefly mentioned above, there are situations wherein a photoelectric reflection sensor of this type using radiation pulses receive both an anticipated kind of optical pulses (emitted from a light emitting device) and noise pulses (say, of a relatively low frequency) which are mixed in such that an outputted true electrical pulse is canceled or the absolute value of its output is significantly reduced. FIG. 6 shows such a situation by way of a timing chart of electrical pulse appearing on the output line of the photoelectric converter 21 in the first and second embodiments of the invention. In FIG. 1, Graph (a) shows the timing of light emitted from the light emitting device 1; Graph (b) shows the waveform Ws of the outputted true electric pulse which appears on the output line of the photoelectric converter 21 in the absence of the noise; Graph (c) shows the noise pulse of waveform Wn with a relatively low frequency which appears from the photoelectric converter 21 when the radiation pulse from the light emitting device 1 is not being received by the light receiving device 2; and Graph (d) shows the mixed pulse (with waveform Ws+n) appearing on the output line of the photoelectric converter 21 when both pulses shown in Graphs (b) and (c) are present.

As shown in Graph (d) of FIG. 6, waveform Ws+n in the mixed presence of radiation pulse from the light emitting device 1 and noise includes edges that correspond to the peaks in the waveform Ws of the true pulse but they are not as sharp and more flowing such that the first and second comparators with threshold values Vth1 and Vth2 can hardly function as a practical matter.

Figure 7:
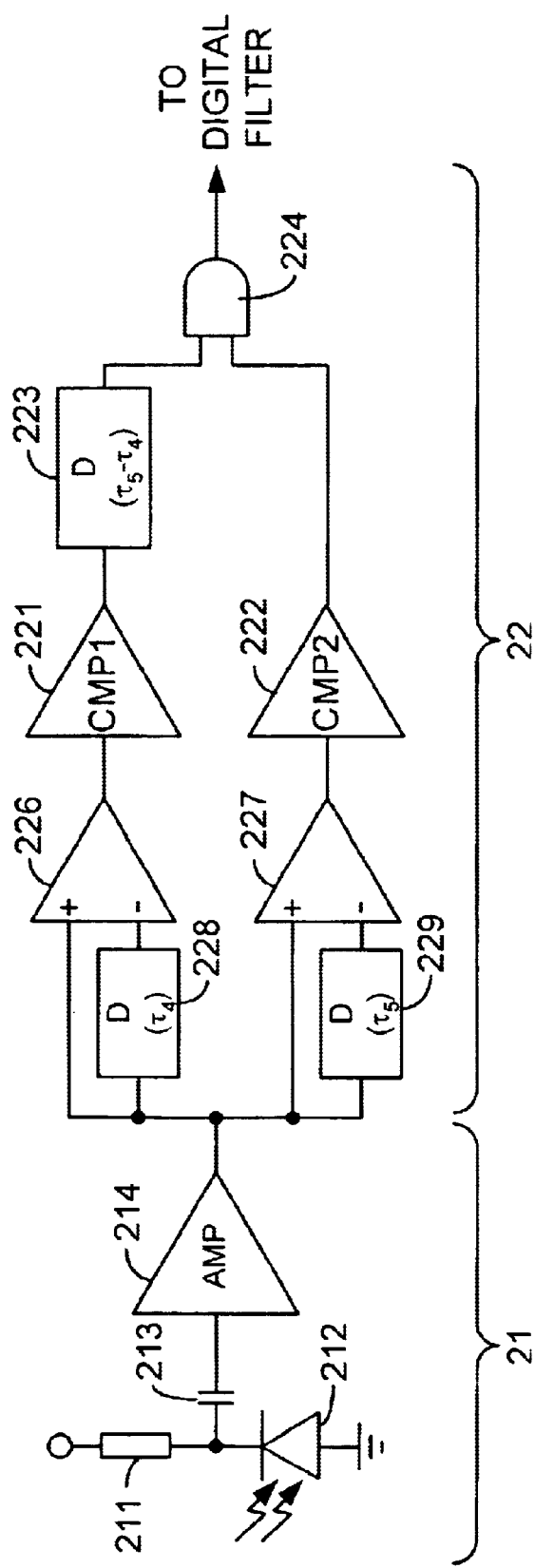
FIG. 7 is a block diagram of a sensor according to a fourth embodiment of this invention.

FIG. 7 shows a fourth embodiment of the invention for making it possible to distinguish between true and false electrical pulses that appear on the output line of the photoelectric converter 21 even in the mixed presence of noise pulses with a relatively low frequency.

The fourth embodiment is different from the first and second embodiments only in the structure of the pulse judging circuit 22. For the simplicity of disclosure, therefore, FIG. 7 shows only the photoelectric converter 21 and the pulse judging circuit 22. It should be evident to a person skilled in the art that the fourth embodiment of the invention can be incorporated in the third embodiment of the invention by replacing the pulse judging circuit 22 with another according to the fourth embodiment.

As shown in FIG. 7, the pulse judging circuit 22 according to the fourth embodiment of this invention also includes, as according to the first and second embodiments, a pair of comparators (the first comparator CMP1 221 and the second comparator CMP2 222), a delay circuit (D) 223 and an AND circuit 224. The delay circuit 223 is for delaying the output from the first comparator CMP1 221 by a set delay time of τ5–τ4. The AND circuit 224 is for taking the logical product of the outputs from the first and second comparators 221 and 222 after the aforementioned delay in the output from the first comparator 221. Additionally, there is a first subtraction circuit 226 inserted between the first comparator 221 and the amplifier 214 and a second subtraction circuit 227 inserted between the second comparator 222 and the amplifier 214, each of the subtraction circuits 226 and 227 serving to output the difference between the inputs through its non-inversion input terminal (+) and inversion input terminal (−). Delay circuits (D) 228 and 229 are inserted respectively between the inversion input terminal (−) of the first and second subtraction circuits 226 and 227 and the amplifier 214 for delaying the input from the amplifier 214 by set delay times τ4 and τ5. The output from the amplifier 214 is inputted to the non-inversion input terminals (+) of the subtraction circuits 226 and 227 without any delay.

Figure 8C:
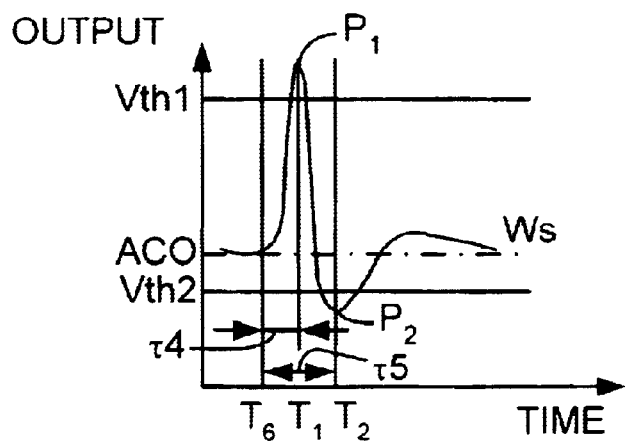

In FIG. 8C, Ws represents the known output waveform of the true electric pulse explained above. The set delay time τ4 is shown as being obtained as the difference between reference time T1 at which the first peak value P1 of the waveform Ws appears and reference time T6 corresponding to the rise time of the output waveform Ws. Similarly, the set delay time τ5 is obtained as the difference between reference time T2 at which the second peak P2 of the waveform Ws appears and the aforementioned rise time of the waveform Ws.

According to the fourth embodiment of the invention, the first subtraction circuit 226 serves to calculate the change in the output during the time interval of τ4 from the electrical pulse appearing on the output line of the photoelectric converter 21, and the first comparator 221 determines therefrom whether this corresponds to the first peak value P1 of the true waveform Ws. Similarly, the second subtraction circuit 227 serves to calculate the change in the output during the time interval of τ5 from the electrical pulse appearing on the output line of the photoelectric converter 21 and the second comparator 222 determines therefrom whether this corresponds to the second peak value P2 of the true waveform Ws. Next, the output from the first comparator 221 is delayed by a set delay time of τ5–τ4 by the delay circuit 223. Thus, the AND circuit 224 compares the outputs from the first and second comparators 221 and 222 by matching them on the time axis.

Thus, even if the mixed pulse Wn+s is as shown in Graph (d) of FIG. 6 such that the output from the photoelectric converter 21 is significantly different from the output of the true electrical pulse, it is possible to distinguish the true pulse waveform Ws from such a mixed pulse Ws+n. In other words, the fourth embodiment of the invention makes it possible to distinguish between true and false pulses even if noise pulses with a relatively low frequency are mixed into true pulses from the light emitting device such that the output of a true pulse is nearly canceled by the noise.

Figure 9:
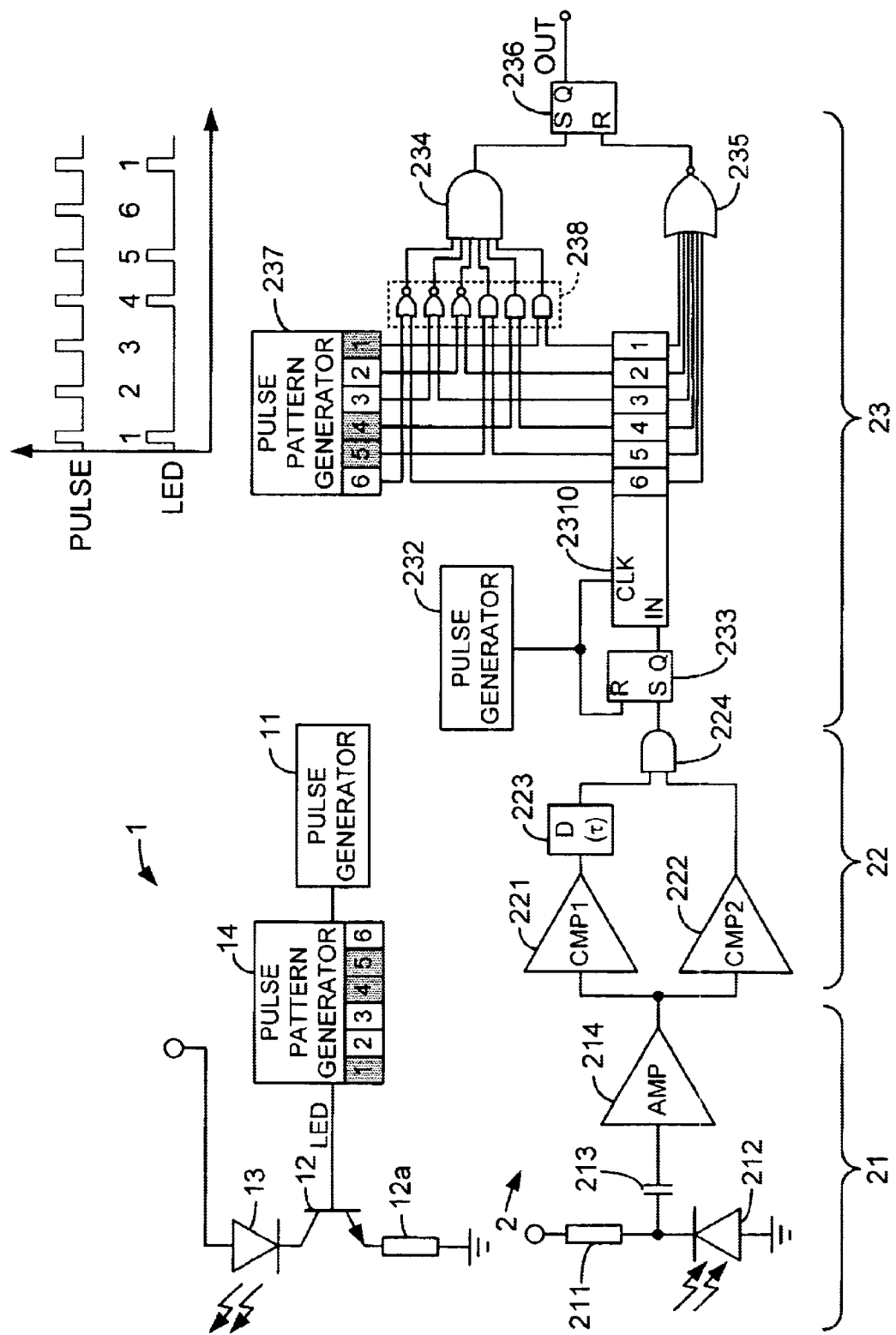
FIG. 9 is a block diagram of a sensor according to a fifth embodiment of this invention.

FIG. 9 shows a fifth embodiment of the invention characterized as providing the first or second embodiment of the invention described above with a bit pattern judging function for judging whether or not a light pulse has been received normally by emitting light from the light emitting device 1 according to a specified bit pattern and using the light receiving device 2 to compare the received bit pattern of the electrical pulse considered to be a true pulse with the specified bit pattern. It should be clear to a person skilled in the art, however, that the fifth embodiment of the invention can similarly be incorporated in the third or fourth embodiment of the invention.

According to the fifth embodiment of the invention, as shown in FIG. 9, the light emitting device 1 is characterized as having a pulse pattern generator 14 inserted between the pulse generator 11 and the driver circuit 12. This pulse pattern generator 14 is for serially generating a light emission bit "1" or "0" in synchronism with the driving pulse from the pulse generator 11, as shown on the top right-hand end of the figure. According to the example shown in FIG. 9, a light pulse is emitted from the driver circuit 12 when the bit from the pulse pattern generator 14 is "1" but no light is emitted from the driver circuit 12 when the bit generated from the pulse pattern generator 14 is "0".

The example in FIG. 9 also shows that the pattern is cyclic with 6 bits per cycle, as indicated by the 6 boxes numbered "1"–"6" in the pulse pattern generator 14. The pulse pattern generator 14 serves to generate bits serially in the predetermined order of "1"→"0"→"0"→"1"→"1"→"0". Of the 6 boxes of the pulse pattern generator 14 shown in FIG. 9, hatched boxes indicate bits "1" and white boxes indicate bits "0". The number of bits in a cycle and the frequency of appearance of each bit "1" or "0" may be selected freely.

Similarly, the light receiving device 2 according to the fifth embodiment of the invention is characterized as having a shift register 2310 with 6 stages corresponding to the number of bits in one cycle of the bit pattern. The "H" and "L" outputs indicating true and false pulse are received sequentially by the stages 1–6 of this shift register 2310 through the first flip-flop 233 according to the timing of the pulse generator 232. The frequencies of pulse generation by the pulse generators 11 and 232 are preliminarily set to be equal.

The digital low pass filter 23 serves to compare the received bit pattern of "H" (or "1") and "L" (or "0") taken into the stages 1–6 of the shift register 2310 with the standard reference bit pattern which is preliminarily stored in a pulse pattern generator 237. This pulse pattern generator 237 is for outputting in parallel (or simultaneously) the same bit pattern as stored in the pattern generator 14 on the side of the light emitting device 1 (although the pattern is written in a reverse order in FIG. 9 for the convenience of presentation).

In the example shown in FIG. 9, a logical circuit group 238 including three AND circuits and three NOR circuits is used to carry out logical calculations on the outputs from the stages 1–6 of the shift register 2310 and the corresponding bit outputs 1–6 from the pulse pattern generator 237. In this example, all outputs from the logical circuit group 238 become "H" when the bits taken into stages 1, 4 and 5 of the shift register 2310 are "1" and those taken into stages 2, 3 and 6 are "0". This makes the output from the AND circuit 234 to be also "H" and the second flip-flop 236 becomes in the set condition. In this situation, the output from the second flip-flop 236 is "H", indicating that the light receiving device 2 is normally receiving the light pulse emitted from the light emitting device 1.

If each of the stages 1–6 of the shift register 2310 is "0" to indicate "L", the output from the NOR circuit 235 is "H" and that from the AND circuit 234 is "L". The second flip-flop 236 is then in the reset condition and its output remains "L" until an input is received from the AND circuit 234.

In summary, the fifth embodiment of the invention is characterized as having a bit pattern judging function in addition to judging whether the electrical pulse appearing on the output line of the photoelectric converter 21 is a true pulse or a false pulse such that the apparent bit pattern of the electrical pulse judged to be true is compared with a standard pattern for determining whether the pulse emitted from the light emitting device has been received by the light receiving device. Thus, the arrival of a true light pulse can be even more accurately detected.

Figure 10:
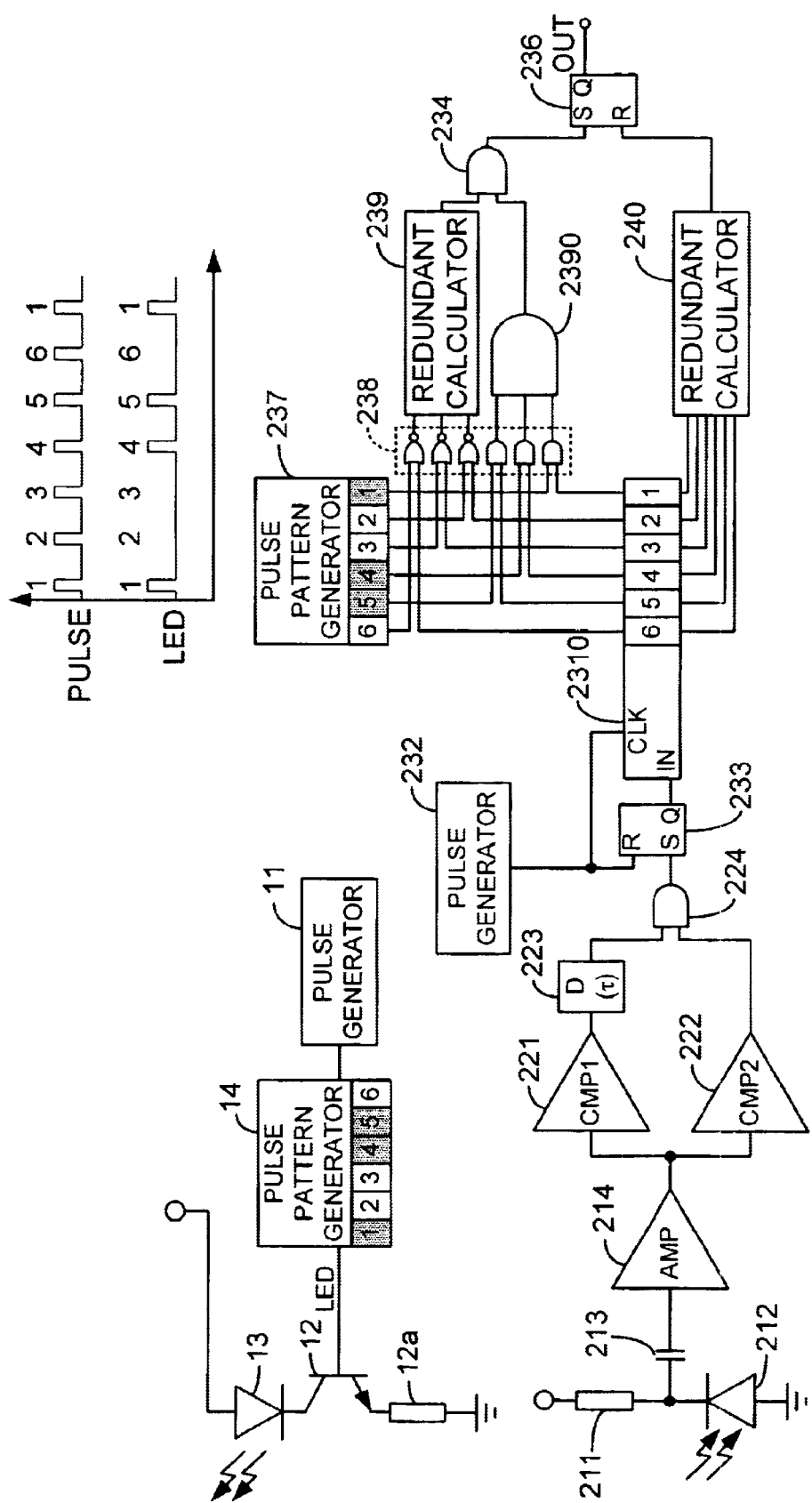
FIGS. 10 and 11 are block diagrams of sensors of two preferred kinds according to the fifth embodiment of this invention.

FIG. 10 shows a preferred variation to the fifth embodiment of the invention described above with reference to FIG. 9, characterized as additionally providing a so-called redundant calculator 239 between the AND circuit 234 and the three NOR circuits of the logical circuit group 238 for providing redundancy to the bit matching process described above. This redundant calculator 239 is for carrying out a logical calculation on the outputs from the NOR circuits on the basis of a redundancy judging standard and outputting the result in terms of "H" and "L" to the AND circuit 234. In this example, the redundancy judging standard may be so set that the output from the redundant calculator 239 will be "H" even if one of the outputs from the three NOR circuits is "L" (or even if only one of the three stages 2, 3 and 6 of the shift register 2310 corresponding to bit "0" generated by the pulse pattern generator 237 is "1"), such that there will be redundancy in the output from the AND circuit 234.

FIG. 10 shows an example whereby there is another redundant calculator 240 inserted between the second flip-flop 236 and the shift register 2310. Although the output from the NOR circuit 235 shown in FIG. 9 does not become "L" unless each stage of the shift register 2310 becomes "0", the output from the second flip-flop 236 can be made "H" because of the redundancy due to this additional redundant calculator 240 even if every stage does not become "0". Thus, even if "1" is entered into a stage due to a noise pulse which has been mixed in when the corresponding bit of the pulse pattern generator 14 is "0", the sensor according to the fifth embodiment of this invention shown in FIG. 10 can accept such a situation within a range that has been set.

Figure 11:
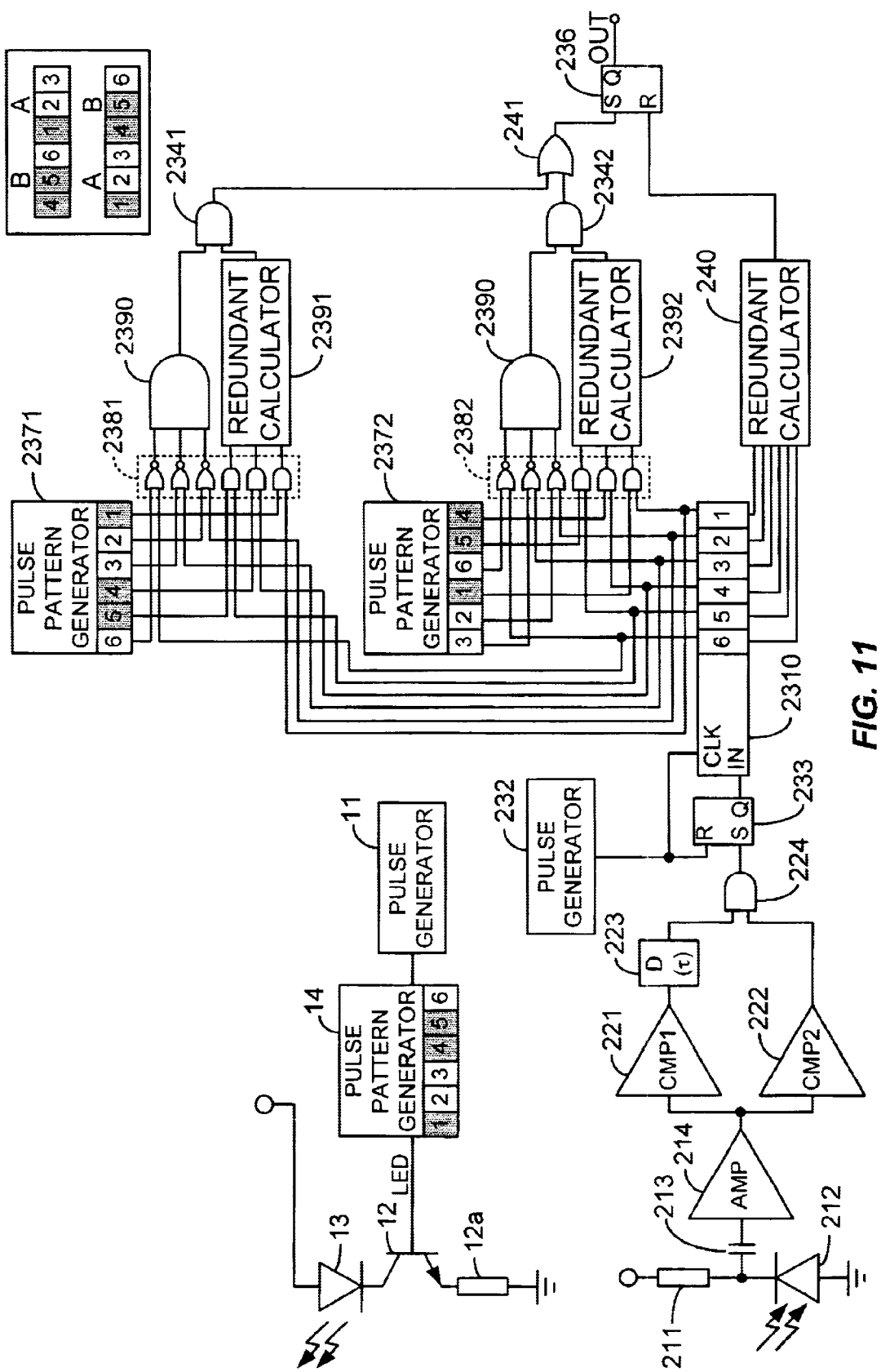

FIG. 11 shows another preferred variation to the fifth embodiment of this invention characterized as having a plurality of pulse pattern generators provided to the light receiving device 2. According to the example shown in FIG. 11, the light receiving device 2 has two pulse pattern generators, the first pulse pattern generator 2371 adapted to output in parallel the same bit pattern 1→2→3→4→5→6 stored in the pulse generator 14 of the light emitting device 1 and the second pulse pattern generator 2372 adapted to output in parallel a reassembled bit pattern 4→5→6→1→2→3.

In this example, the reassembled bit pattern and the first bit pattern are related such that if the first half and the second half each of three bits of the first pattern are designated respectively as A and B, as shown inside a frame in FIG. 11, the first pattern may be written as A+B and the reassembled bit pattern may be rewritten as B+A. Thus, it may be said that two standard bit patterns A+B and B+A are prepared according to this example and these two patterns are simultaneously compared with the pattern which appears on the 6 stages of the shift register 2310. Thus, when the pattern A+B is transmitted repeatedly from the light emitting device 1 (say, A→B→A . . . ), even if the first bit pattern A is missing due to a noise, for example, the comparison can be completed without waiting for the next appearance of the bit pattern A+B but as soon as the bit pattern B+A appears next. In other words, the comparison between an apparent bit pattern and a standard bit pattern can be completed more speedily and hence that the response time of the photoelectric sensor is improved.

Figure 12:
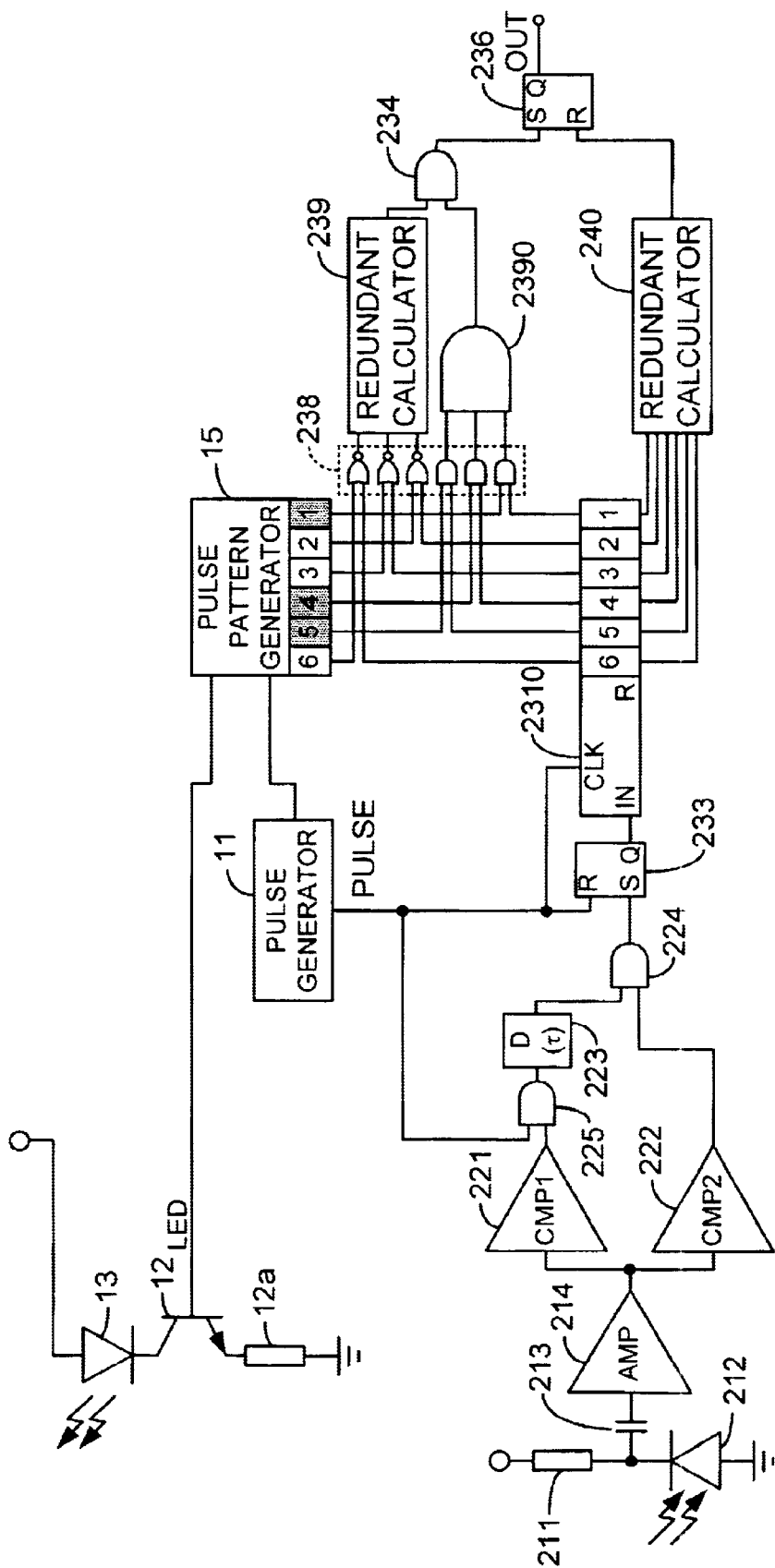
FIG. 12 is a block diagram of a sensor according to a sixth embodiment of this invention.

FIG. 12 shows a photoelectric sensor according to a sixth embodiment of this invention characterized as having a bit pattern judging function as described above provided to the second embodiment of the invention having the light emitting device and the light receiving device integrated into a single light emitting and receiving device. FIG. 12 shows an example with two redundant calculators 239 and 240 for providing redundancy at the time of matching bit patterns.

Numeral 15 indicates a pulse pattern generator serving to emit a light pulse on the basis of driver pulse from the pulse generator 11. The pulse pattern generator 15 transmits a preliminarily specified bit pattern to the driver circuit 12 in synchronism with the driver pulse from the pulse generator 1. The light emitting element 13 emits light to the target area in synchronism with the bit pattern sent from the pulse pattern generator 15. The pulse pattern generator 15 also outputs the preliminarily specified bit pattern to the light receiver 2. The bit pattern outputted from the pulse pattern generator 15 and the bit pattern taken in the stages 1–6 of the shift register 2310 are matched. Thus, the bit pattern judging function can be provided also to the second embodiment of the invention.

Although an example was shown above for providing two bit pattern combinations (A+B and B+A), this is not intended to limit the scope of the invention. A bit pattern may be divided into three combinations, for example, and three standard bit patterns may be prepared. Although only one light emission bit pattern (A→B→A . . . ) was shown above, neither is it intended to limit the scope of the invention. A plurality of bit patterns may be prepared for the light emission (such as A→B→C, D→E→F . . . ) such that the light emitting device 1 can freely choose one of them. It is also possible to prepare a completely random bit pattern for light emission. In such a situation, however, it goes without saying that it is necessary to preliminarily provide the light receiving device 2 with a corresponding standard bit pattern or to have data related to bit patterns exchanged between the light emitting device 1 and the light receiving device 2 such that the light receiving device 2 can match the apparent bit pattern according to a corresponding standard bit pattern corresponding to the bit pattern for the light emission.

When the bit pattern judging function as explained above is applied to a photoelectric sensor, the following factors are considered to be important: (1) a short sensor response; (2) a limited number of basic frequencies for the row of transmission pulses; (3) limited basic duty ratio of the row of transmission pulses; and (4) separate clocks between the devices. It is desirable to design a bit pattern judging function such that these conditions are properly satisfied.

If the number of bits is increased in order to remove noise pulse, it becomes possible to reduce the degree of similarity to the noise pulse. Although a large number of bits may be secured without increasing the code length if the bit length (the interval between pulse emission) is made shorter, most photoelectric sensors have restricting conditions on bit length, and it is difficult as a practical matter to increase the bit number sufficiently. Experimentally, however, it has been found that a bit number of about 30 is required in order to completely eliminate noise pulse with frequency of several tens of kHz such as a fluorescent lamp or a randomly generated noise pulse. Methods of securing 30 bits while restricting conditions peculiarly on photoelectric sensors (such as sensitivity and response time) are satisfied will be discussed below.

FIG. 13B shows an example of bit arrangement with bit length=30, the hatched bits indicating light-emitting bits ("1") and white bits indicating non-light-emitting bits ("0"). In this example, the entire code is divided into two blocks A and B. FIG. 13B shows both an example starting with A (top line) and another example (bottom line).

The so-called maximal-length sequence known in communication engineering may be used in the pattern arrangement of bits indicating emission and non-emission of light.

The signal-to-noise ratio (S/N) is roughly determined by the pulse width of emitted light and the frequency characteristic of the light receiving amplifier. As the pulse width is reduced, the frequency band width of the light receiving amplifier must be increased and this adversely affects the S/N. If the conversion time of the amplifier is made faster in order to reduce the bit length, on the other hand, the low frequency part of the band for the amplifier must be cut and this also affects the S/N adversely. In view of these, it seems appropriate to select bit length to be about 20 $\mu$s and the pulse width of emitted light about 2.5 $\mu$s, although this is not the case in applications where the level sensitivity for a general-purpose photoelectric sensor is not being required.

In the case of a photoelectric sensor containing an amplifier with response time of 1 ms, for example, this response time becomes the largest problem in limiting the bit number. In such a situation, the sensor will have to read out all bit patterns of code emitted within up to 1 ms including variations. If one simply divides 1 ms by the bit length determined by the restriction due to sensitivity discussed above, the maximum bit number becomes 50. In the case of a photoelectric sensor, however, the response time means the maximum time from the moment when a target object is spotted until a detection signal is outputted. In other words, it is not that the response time is directly determined by the bit length. Factors that control the response time will be considered next.

Clock signals for a sensor are usually generated inside an IC. In such a case, the absolute value of clock signals frequently vary by about ±20% due to the CR variations inside the IC. For such situations, it is advisable to set the response time of the sensor itself to be about 0.8 times such that a desired response time will be kept even in the presence of clock signal variations of up to ±20%. (If the response time is 1 ms, the sensor response time is set to 800 $\mu$s.) With this consideration, the maximum bit number becomes 40. If this presents a problem (for reasons to be discussed below), an oscillator or the like may be provided externally to generate an accurate clock signal.

If the pulse for light emission is codified (to be made into a bit pattern), a problem occurs in that the detection cannot be completed until all codes are received. This becomes a serious problem especially with a photoelectric sensor of the type with separate light emitting and receiving devices such that the light receiving device is not informed which timing of code is being emitted.

Figure 14A:
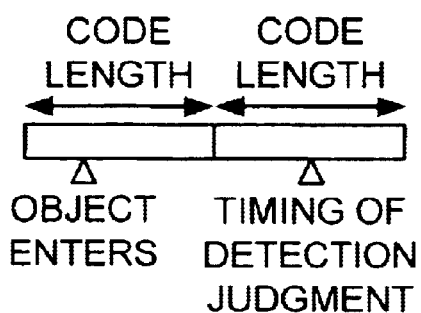

Next will be discussed a problem when an object enters the target area of a photoelectric sensor while it is being codified. FIG. 14A shows a situation where the time interval from the moment when a target object enters the target area until a judgment of detection is made is longer than the code length, up to twice the code length. This makes it necessary to reduce the code length to be less than one half of the response time. In view of the maximum code length discussed above, this means that the number of bits can only be made 25. This is not sufficient for removing noise pulse.

Figure 14B:
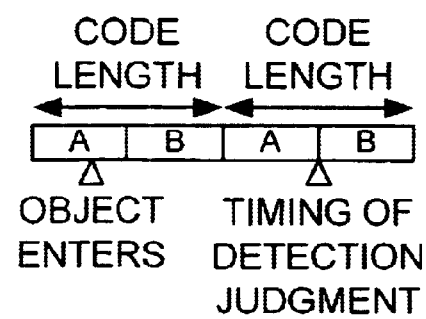

If the entire code length is divided into two blocks A and B as shown in FIG. 14B such that the reception may be either A→B or B→A. FIG. 13B shows when the code length is 30 bits and A→B is received (top line in FIG. 13A) and B→A is received (bottom line in FIG. 13B).

In this example, the maximum time taken between the moment when a target object enters the target area until it is detected is 1.5 times the code length. Thus, the maximum code length can be 33 bits. If the code length is divided into three blocks, the maximum code length becomes 37.

In the case of a transmission type photoelectric sensor having the light emitting and receiving devices separated, it may become likely to make an error in reading the bits ("bit slip") if the clock signals for the light emitting and receiving are significantly different. This problem can be overcome by mixing an error correcting symbol in the code.

If the number of bits necessary for the error correcting symbol cannot be secured because of the code length is limited, the occurrence of an error can be prevented by reducing the clock error such that the bit slip will not occur within the code. If the code length is 800 $\mu$s and the bit length is 20 $\mu$s, for example, the clock error becomes less than ±1.25% (20/80/2). This can be done, for example, by attaching a ceramic oscillator externally to the IC.

Although it was stated above that a pulse width of about 2.5 $\mu$s is desirable for a photoelectric sensor, there is a certain restriction regarding the pulse duty. In order to make the current peak for the light emission from a photoelectric sensor as large possible, it is desirable to make the pulse duty as small as possible such that the total average current consumption can be limited. If it is attempted to keep the pulse duty at about 2.5%, this will mean that light can be emitted only once per bit with the pulse width 2.5 μs and bit length 20 μs. Since the light-emitting bits are limited to 6 if the bit number is 30, an optimum bit pattern must be selected within this limitation. Thus, a combination is selected such that the pulse intervals are separated as much as possible, or the spectrum will be spread as much as possible.

Figure 15A:
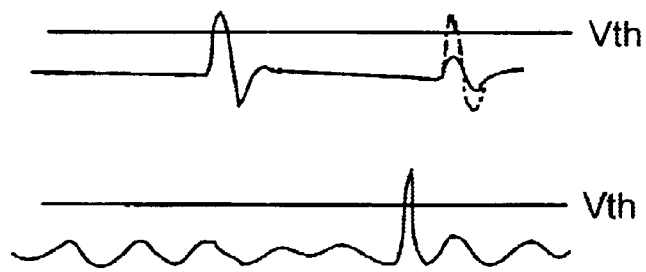
FIG. 15 is a diagram for explaining effects of noise on a bit pattern when light with a bit pattern is emitted and received.

FIG. 15A shows how a misjudgment can be caused by noise. The upper line shows an example where a noise pulse cancels a true pulse (a pulse emitted by the sensor itself). This, however, is a rare case. This problem can be obviated by a photoelectric sensor of the type which uses received pulse only while a pulse is being emitted. This problem can be ignored also if a low pass filter (shift register) is used.

The second line of FIG. 15A shows an example where a noise pulse may cause the sensor to misjudge and erroneously conclude that a true pulse has been received although it actually has not. This situation can happen more frequently and especially due to randomly generated noise.

Figure 15B:
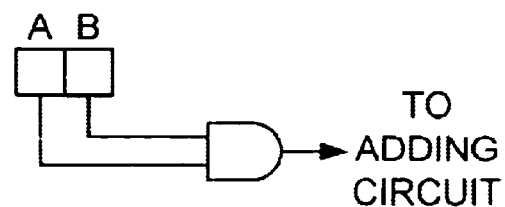

FIG. 15B shows a method whereby it is concluded that a true pulse has been received only if two bits in a row indicate light emission. A short noise such as so-called shot noise with duration less than 2 bits can also be identified if the bit pattern judging means is programmed to identify emission only if two successive bits indicate light emission.

What is claimed is:

1. A photoelectric sensor comprising:

an emitting device for emitting light pulses repeatedly to a target area; and a receiving device for receiving said light pulses arriving through said target area, said receiving device including converting means having an output line for converting the received light pulses into electrical pulses;

said emitting device including pulse transmitting means for transmitting said light pulses according to an emission bit pattern based on arrangement of bits each indicating emission and non-emission of light, respectively;

said receiving device including:

bit generating means for generating light indicating bits each indicative of whether or not an electrical pulse appeared on said output line of said converting means; and bit pattern judging means for making comparisons simultaneously between a received bit pattern based on said light indicating bits and a two or more standard bit patterns based on said emission bit pattern and judging from the result of said comparisons whether a light pulse emitted from said emitting device has been normally received;

said photoelectric sensor generating an output signal on the basis of result of judging by said bit pattern judging means.

2. The photoelectric sensor of claim 1, wherein said emitting device further includes means for generating randomly said emission bit pattern.

3. The photoelectric sensor of claim 1, wherein said bit pattern judging means makes said comparison with redundancy.

4. The photoelectric sensor of claim 1, wherein said emission bit pattern includes at least two bits in a row indicating emission.

5. The photoelectric sensor of claim 1, wherein the number of bits in said emission bit pattern is variable.

6. The photoelectric sensor of claim 1, wherein the length of bit in said emission bit pattern is variable.

* * * * *